United States Patent [19]
Awata et al.

[11] Patent Number: 5,399,985
[45] Date of Patent: Mar. 21, 1995

[54] DIGITAL PLL CIRCUIT

[75] Inventors: Yutaka Awata; Nobukazu Koizumi; Yasuo Ohtomo; Mitsuo Kakuishi, all of Kawasaki, Japan

[73] Assignee: Fujitsu Limited, Kanagawa, Japan

[21] Appl. No.: 33,001

[22] Filed: Mar. 18, 1993

[30] Foreign Application Priority Data

Mar. 18, 1992 [JP] Japan .................................. 4-062239

[51] Int. Cl.[6] .......................... H03K 5/13; H03L 7/18; H03L 7/087; H03L 7/089
[52] U.S. Cl. .................................... 327/159; 327/237; 327/553
[58] Field of Search ...................... 307/510, 511, 526; 328/55, 155

[56] References Cited

U.S. PATENT DOCUMENTS

| | | | |
|---|---|---|---|
| 4,577,163 | 3/1986 | Culp | 328/155 |
| 4,791,386 | 12/1988 | Shiga | 328/155 |
| 5,015,970 | 5/1991 | Williams et al. | 307/526 |
| 5,077,529 | 12/1991 | Ghoshal et al. | 328/155 |

FOREIGN PATENT DOCUMENTS

63-35039  2/1988  Japan .

*Primary Examiner*—William L. Sikes
*Assistant Examiner*—Fetsum Abraham

[57] ABSTRACT

The invention provides a digital PLL circuit wherein the integration time constant of a random walk filter can be varied adaptively in response to a frequency error. A master clock signal having a frequency equal to N (integral number) times that of an input clock signal is normally divided by N by a divider, and the division output of the divider and the input clock signal are compared in phase with each other by a phase comparator. The dividing ratio of the divider is temporarily varied in accordance with a result of the comparison so as to make the phases of the division output and the input clock signal coincide with each other to establish synchronism between them. A variable step number random walk filter is interposed between the phase comparator and the divider and has a selectively settable integration time constant, and an integration time constant setting circuit varies the step number of the random walk filter in accordance with information of a last phase controlling direction or directions and information of a phase controlling direction at present to vary the integration time constant of the random walk filter.

8 Claims, 7 Drawing Sheets

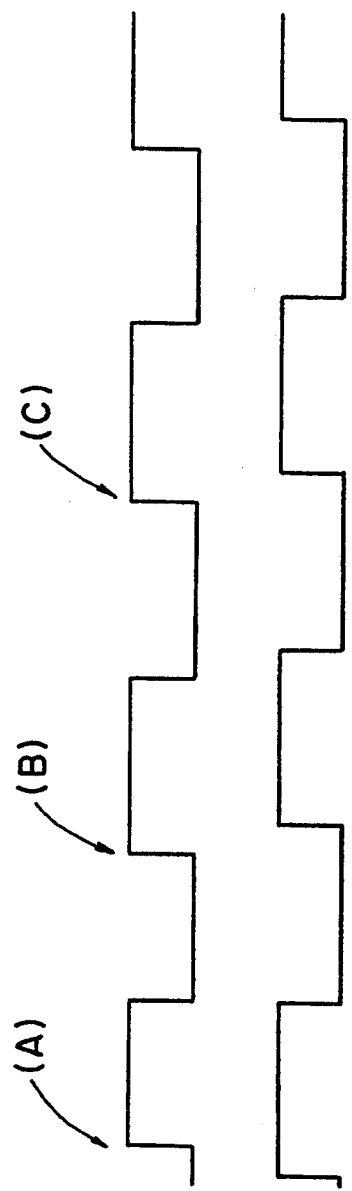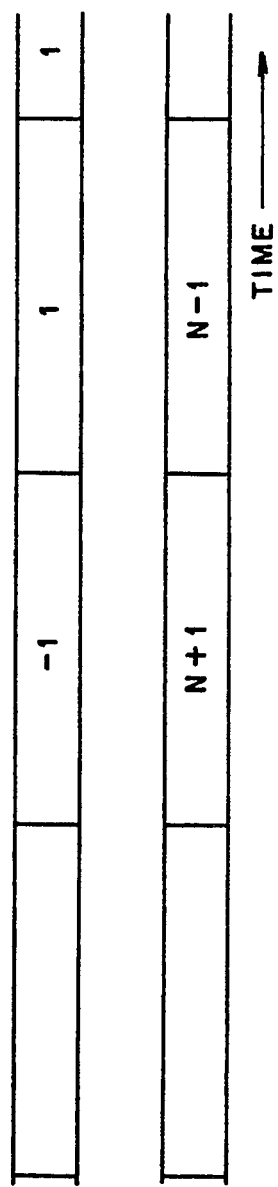
FIG. 2(a) INPUT CLOCK
FIG. 2(b) OUTPUT CLOCK
FIG. 2(c) PHASE COMPARATOR OUTPUT
FIG. 2(d) RWF COUNT VALUE (STEP NUMBER 1)
FIG. 2(e) DIVIDING RATIO

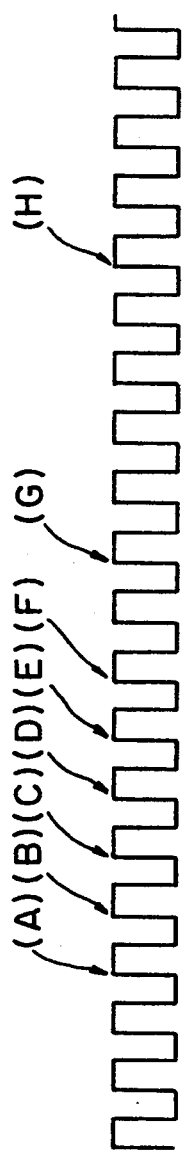
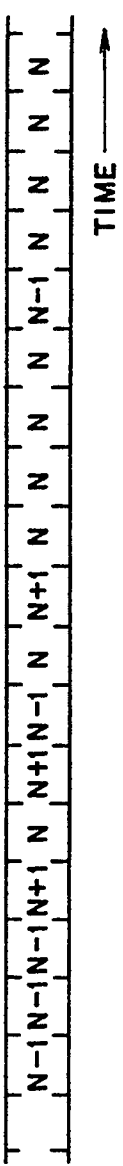
FIG.3(a) OUTPUT CLOCK
FIG.3(b) PHASE COMPARATOR
FIG.3(c) RWF COUNT VALUE
FIG.3(d) RWF STEP NUMBER
FIG.3(e) RWF OVERFLOW
FIG.3(f) DIVIDING RATIO

INPUT

OUTPUT (PHASE LAG)

MASTER CLOCK

FIG. 8(a) PRIOR ART INPUT
FIG. 8(b) PRIOR ART OUTPUT (PHASE LEAD)
FIG. 8(c) PRIOR ART MASTER CLOCK
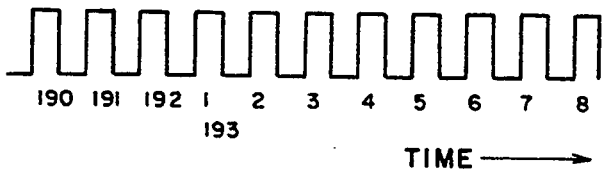
FIG. 9
PRIOR ART
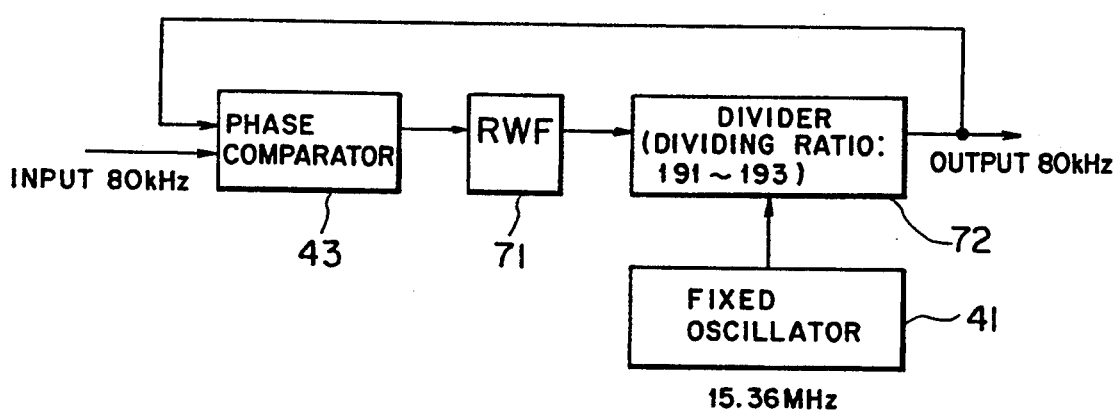

DIGITAL PLL CIRCUIT

BACKGROUND OF THE INVENTION

This invention relates to a digital PLL (phase-locked loop) circuit.

A digital PLL circuit divides a master clock signal having a frequency equal to N (integral number) times the frequency of an input signal (clock signal) normally by N, compares the phases of the division output signal and the input signal with each other, and divides the input signal so that the phases of them may coincide with each other (for example, by temporarily varying the dividing ratio N) to synchronize the division output signal with the input signal.

An exemplary one of conventional digital PLL circuits is shown in FIG. 6. Referring to FIG. 6, the conventional digital PLL circuit shown includes a fixed oscillator 41 which oscillates a master clock signal of a frequency of 15.36 MHz which is equal to 192 times the frequency of 80 kHz of an input signal.

The digital PLL circuit further includes a divider (frequency divider) 42 which divides the master clock signal from the fixed oscillator 41. The dividing ratio of the divider 42 is variable between 191 and 193.

The digital PLL circuit further includes a phase comparator 43 which compares the input signal in phase with the output of the divider 42.

In operation, the master clock signal of the frequency of 15.36 MHz generated by the fixed oscillator 41 is divided by 191 or 193 by the divider 42. The phase comparator 43 compares the phases of the input signal and the output of the divider 42 with each other, and when the phase of the output of the divider 42 lags with respect to that of the input signal, the phase comparator 43 controls the divider 42 so that the dividing ratio of the divider 42 may be 191 (refer to the waveforms (a) to (c) in FIG. 7). On the contrary, when the phase of the output of the divider 42 leads with respect to that of the input signal, the phase comparator 43 controls the divider 42 so that the dividing ratio of the divider 42 may be 193 (refer to the waveforms (a) to (c) of FIG. 8).

FIG. 9 shows another exemplary one of conventional digital PLL circuits. Referring to FIG. 9, the conventional digital PLL circuit shown includes a fixed oscillator 41 and a phase comparator 43 similar to those of the conventional digital PLL circuit shown in FIG: 6. The conventional digital PLL circuit further includes a random walk filter (RWF) 71 having a function of an integrating circuit and thus having a function of suppressing a jitter or error components.

The digital PLL circuit further includes a divider (frequency divider) 72 which divides a master clock signal from the fixed oscillator 41 and has a dividing ratio which is variable among 191, 192 and 193.

It is assumed here that the initial value of the random walk filter 71 is 0 and the dividing ratio of the divider 72 is 192.

In operation, when the phase comparator 43 determines that the output of the divider 72 leads in phase to the input signal, the random walk filter 71 decrements its value by one, but on the contrary when the phase comparator 43 determines that the output of the divider 72 lags in phase with respect to the input signal, the random walk filter 71 increments its value by one. When the value of the random walk filter 71 becomes equal to an integration time constant thereof on the positive side as a result of repetition of the operations just described, the dividing ratio of the divider 72 is varied to 191 and the value of the random walk filter 71 is cleared to 0. On the contrary when the value of the random walk filter 71 becomes equal to its integration time constant on the negative side, the dividing ratio of the divider 72 is varied to 193 and the value of the random walk filter 71 is cleared to 0.

It is to be noted that, when the value of the random walk filter 71 does not overflow, that is, in any other case than those cases described just above (that is, when the absolute value of the value of the random walk filter 71 is smaller than the integration time constant), the dividing ratio of the divider 72 is maintained at 192.

When the input signal has some jitter or some error component and it is desired to suppress the jitter of the output signal, such a digital PLL circuit including a random walk filter as the conventional digital PLL circuit shown in FIG. 9 is employed commonly. In this instance, when it is desired to enhance the jitter suppressing effect, the integration time constant of the random walk filter 71 is increased. However, when the frequency error of the master clock signal is great, the magnitude of the integration time constant is limited. This is because, while the amount by which the phase can be controlled once by the divider 72 must be greater than the amount of displacement in phase by a frequency error, if the integration time constant is increased, then the interval in which phase control is performed becomes long and the phase is displaced by the frequency error during the interval.

In particular, where the input frequency is represented by $f_{in}$, the dividing ratio by N, the frequency of the master clock signal by $f_m$, and the integration time constant by MOF, then when $f_{in} > f_m/N$, $$((1/f_{in}) - (1/f_m/N)) \times MOF < 1/f_m$$

but when $f_{in} > f_m/N$, $$((1/(f_m/N)) - (1/f_{in})) \times MOF < 1/f_m$$

In other words, when $f_{in} > f_m/N$, $MOF < (f_{in}/(f_{in} \times N - f_m))$, but when $f_{in} < f_m/N$, $MOF < (f_{in}/(f_m - f_{in} \times N))$.

Therefore, since normally a maximum frequency error is provided as a characteristic of an oscillator used for a supply source of a master clock signal, the random walk filter 71 is designed with an integration time constant calculated in accordance with the equation above based on the maximum value.

However, in such a conventional digital PLL circuit as described above, since the integration time constant of the random walk filter is fixed, normally the random walk filter is designed with an integration time constant which can be calculated using a maximum frequency error provided as a characteristic of an oscillator used as a supplying source of a master clock signal. However, since the maximum frequency error provided as a characteristic of an oscillator commonly includes initial fluctuation, temperature variation, secular variation and so forth, an ordinary frequency error is smaller in most cases than the maximum frequency error, and the interval after which phase control is performed becomes excessively short. Consequently, there is a tendency that phase control is performed excessively frequently and the jitter width likely becomes large.

SUMMARY OF THE INVENTION

It is an object of the present invention to provide a digital PLL circuit wherein the integration time constant of a random walk filter can be varied adaptively in response to a frequency error.

In order to attain the object described above, according to the present invention, there is provided a digital PLL circuit which comprises a master clock oscillator for oscillating a master clock signal having a frequency equal to N times the frequency of an input clock signal, N being an integral number, a variable dividing ratio divider for dividing the master clock signal from the master clock oscillator by a dividing ratio which is normally equal to N, the dividing ratio of the divider being temporarily variable to another integral number around N, a phase comparator for comparing the phases of a division output of the divider and the input clock signal with each other, a variable step number random walk filter interposed between the phase comparator and the divider and having a selectively settable integration time constant for providing an output to temporarily vary the dividing ratio of the divider, and an integration time constant setting circuit coupled to the random walk filter, for varying the step number of random walk filter in accordance with information of the last phase controlling direction and information of a phase controlling direction at present obtained from the output of the random walk filter, to vary the integration time constant of the random walk filter.

The integration time constant setting circuit may determine whether or not information of a phase controlling direction in the last phase control cycle and information of a phase controlling direction at present coincide with each other and vary the step number of the random walk filter such that it decreases the step number when the information of the two phase controlling directions coincides with each other, but it increases the step number when the information of the two phase controlling directions does not coincide with each other.

In this instance, the integration time constant setting circuit may include a coincidence detecting circuit for determining whether or not the information of the phase controlling direction in the last phase controlling cycle and the information of the phase controlling direction at present coincide with each other, and a bidirectional counter for outputting a controlling signal to the random walk filter to decrease the step number of the same when the coincidence detecting circuit determines coincidence of the information but outputting another controlling signal to the random walk filter to increase the step number of the same when the coincidence detecting circuit determines incoincidence of the information.

Alternatively, the integration time constant setting circuit may take the majority of information of a plurality of last phase controlling directions and information of a phase controlling direction at present and vary the step number of the random walk filter such that it decreases the step number when the phase controlling directions are one-sided but increases the step number when the phase controlling directions are not one-sided.

In this instance, the integration time constant setting circuit may include a shift register for storing information of a plurality of last phase controlling directions and information of a phase controlling direction at present successively in a time series relationship therein, a majority circuit for taking the majority of the information of the plurality of last phase controlling directions and the information of the phase controlling direction at present based on an output of the shift register, and a bidirectional counter for outputting a controlling signal to the random walk filter to decrease the step number of the same when the majority circuit determines that the phase controlling directions are one-sided but outputting another controlling signal to the random walk filter to increase the step number of the same when the majority circuit determines that the phase controlling directions are not one-sided.

The majority circuit may include a cumulative adding circuit for cumulatively adding the information of the plurality of last phase controlling directions and the information of the phase controlling direction at present successively stored in a time series relationship in the shift register to obtain integration information, and a judging circuit for judging from a result of calculation by the cumulative adding circuit whether or not the phase controlling directions are one-sided and for decrementing the bidirectional counter when the phase controlling directions are one-sided but incrementing the bidirectional counter when the phase controlling directions are not one-sided.

The random walk filter may be formed as a bidirectional counter having a variable overflow value.

The dividing ratio of the variable dividing ratio divider may be temporarily variable to $N-1$ or $N+1$ in response to the output of the random walk filter.

In the digital PLL circuit, the master clock signal having a frequency equal to N times the frequency of the input clock signal is normally divided by N by the divider, N being an integral number, and the division output of the divider and the input clock signal are compared in phase with each other by the phase comparator. The dividing ratio of the divider is temporarily varied in accordance with a result of the comparison from the phase comparator so that the phases of the division output of the divider and the input clock signal may coincide with each other in order to establish synchronism between them. In this connection, the integration time constant setting circuit varies the step number of the random walk filter in accordance with information of the last phase controlling direction and information of a phase controlling direction at present to vary the integration time constant of the random walk filter.

In particular, the integration time constant setting circuit determines whether or not information of a phase controlling direction in the last phase controlling cycle and information of a phase controlling direction at present coincide with each other, and varies the step number of the random walk filter such that it decreases the step number when the information of the two phase controlling directions coincides with each other but increases the step number when the information of the two phase controlling directions does not coincide with each other. Or alternatively, the integration time constant setting circuit takes the majority of information of a plurality of last phase controlling directions and information of a phase controlling direction at present and varies the step number of the random walk filter such that it decreases the step number when the phase controlling directions are one-sided but increases the step number when the phase controlling directions are not one-sided.

Thus, with the digital PLL circuit of the present invention, based on the idea that, when the last phase controlling direction or directions are one-sided, the integration time constant of the random walk filter can be decreased since the frequency error of the master clock signal is great, but on the contrary when the last phase controlling direction or directions are not one-sided, the integration time constant of the random walk filter can be increased since the frequency error of the master clock signal is small, the magnitude of the frequency error is determined in accordance with information of a last phase controlling direction or directions and a phase controlling direction at present, and the magnitude of the integration time constant of the random walk filter is varied adaptively in response to the magnitude of the frequency error thus determined. Accordingly, the digital PLL circuit is advantageous in that phase control can be performed at appropriate intervals and phase displacement and a jitter can be suppressed to the utmost. It is also advantageous in that it can be realized with a simple circuit configuration.

Further objects, features and advantages of the present invention will become apparent from the following detailed description when read in conjunction with the accompanying drawings in which like parts or elements are denoted by like reference characters.

BRIEF DESCRIPTION OF THE DRAWINGS

FIGS. 2(a-e) are a time chart illustrating operation of the digital PLL circuit of FIG. 1;

FIGS. 3(a-) are a time chart illustrating operation of the digital PLL circuit of FIG. 1;

FIG. 8(a-c) is a similar view but illustrating operation of the digital PLL circuit of FIG. 6 when the output leads in phase with respect to the input; and FIG. 9 is a block diagram showing another conventional digital PLL circuit.

DESCRIPTION OF THE PREFERRED EMBODIMENTS a. First Embodiment

Figure 1:
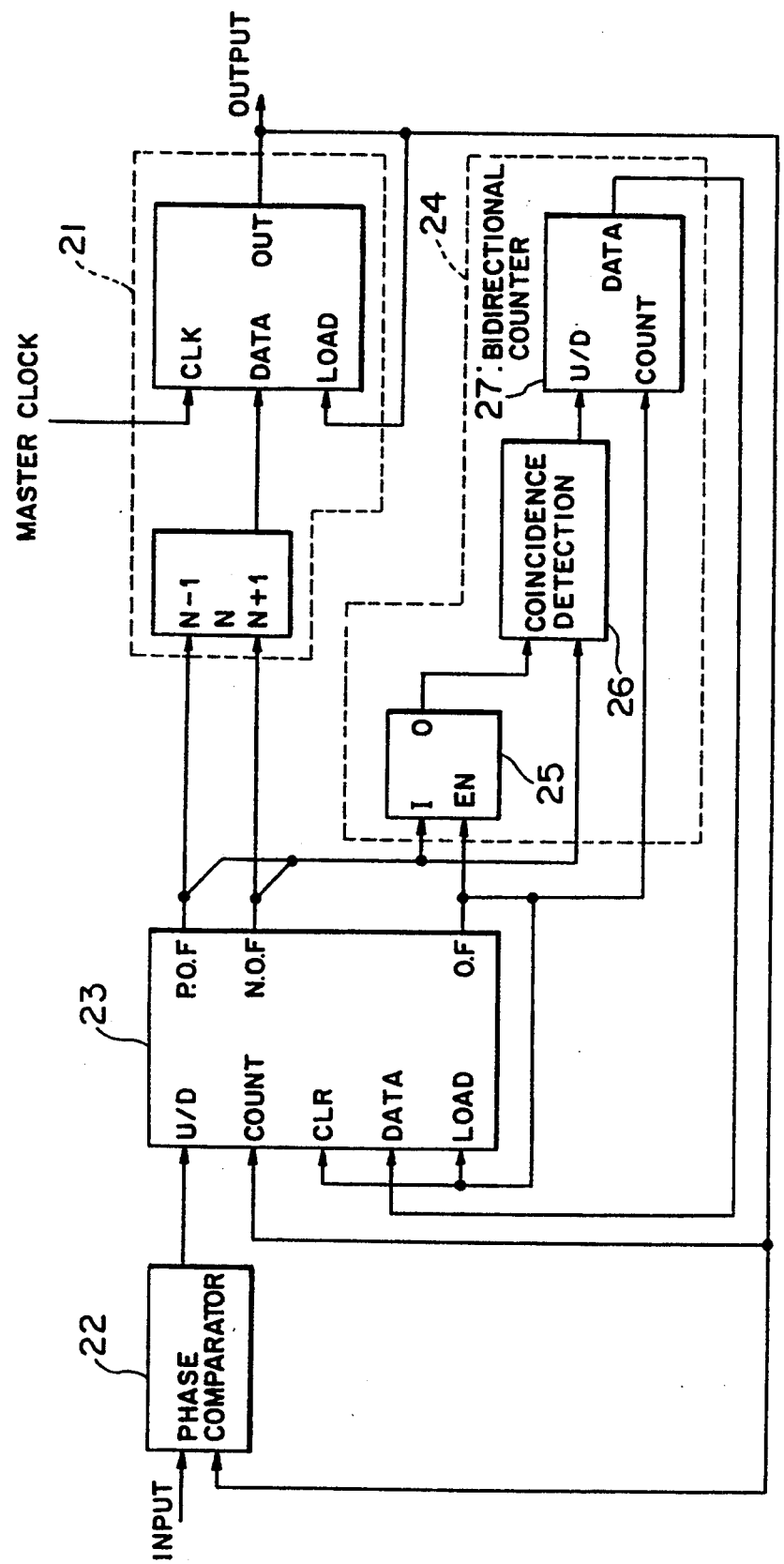
FIG. 1 is a block diagram of a digital PLL circuit showing a first preferred embodiment of the present invention.

Referring first to FIG. 1, there is shown a digital PLL circuit according to a first preferred embodiment of the present invention. The digital PLL circuit shown includes a divider 21 having a variable dividing ratio. The divider 21 divides a master clock signal having a frequency equal to N (integral number such as, for example, 192) times the frequency of an input clock signal usually by N. The dividing ratio of the divider 21, however, can be temporarily varied to N−1 or N+1 in response to the output of such a variable step number random walk filter 23 having a variable step number as hereinafter described.

The digital PLL circuit further includes a phase comparator 22 which compares the phases of the division output of the divider 21 and the input clock signal.

The digital PLL circuit further includes a variable step number random walk filter 23 having a variable step number. The variable step number random walk filter 23 has a function of an integrating circuit and thus has a function of suppressing a jitter or an error component included in the input signal. The variable step number random walk filter 23 is constituted principally from a bidirectional counter having a variable overflow value.

The digital PLL circuit further includes an integration time constant setting circuit 24 which is constructed so as to vary the step number of the variable step number random walk filter 23 in accordance with information of a phase controlling direction in the past and information of a phase controlling direction at present to change the integration time constant thereof. More particularly, the integration time constant setting circuit 24 determines whether or not information of a phase controlling direction in the last phase controlling cycle and information of a phase controlling direction at present coincide with each other, and when the information of the two phase controlling directions coincides with each other, the integration time constant setting circuit 24 varies the step number of the variable step number random walk filter 23 so as to be decreased, but when the information does not coincide with each other, the integration time constant setting circuit 24 varies the step number of the variable step number random walk filter 23 so as to be increased. The integration time constant setting circuit 24 includes a register 25, a coincidence detecting circuit 26 and a bidirectional counter 27.

The register 25 is used to store therein information of a phase controlling direction in the last phase controlling cycle, and the coincidence detecting circuit 26 detects whether or not the information of the phase controlling direction in the last phase controlling cycle and information of the phase controlling direction at present coincide with each other. The bidirectional counter 27 outputs a controlling signal to the variable step number random walk filter 23 to decrease the step number when the result of determination of the coincidence detecting circuit 26 represents coincidence, but on the contrary when the result of determination of the coincidence detecting circuit 26 represents incoincidence, the bidirectional counter 27 outputs another controlling signal to the variable step number ransom walk filter 23 to increase the step number.

For example, when the result of determination of the coincidence detecting circuit 26 represents "coincidence", the coincidence detecting circuit 26 outputs the binary information "1" to the bidirectional counter 27 to decrement the count value of the same, but on the contrary when the result of determination represents "incoincidence", the coincidence detecting circuit 26 outputs the binary information "0" to the bidirectional counter 27 to increment the count value of the same. The bidirectional counter thus outputs a controlling signal to the variable step number random walk filter 23 to increase or decrease the step number of the same in accordance with the count value.

Operation of the digital PLL circuit having such construction as described above will be described subsequently with reference to FIGS. 1 to 3.

First, the coincidence detecting circuit 26 of the integration time constant setting circuit 24 detects whether or not information of a phase controlling direction in the last phase controlling cycle stored in the register 25 and information of a phase controlling direction at present coincide with each other. When the information of the two directions coincides with each other, the bidirectional counter 27 is decremented, but on the contrary when the information does not coincide with each other, the bidirectional counter 27 is incremented.

By the way, the count value of the bidirectional counter 27 is used as a step number input to the variable step number random walk filter 23. While the step number of the variable step number random walk filter 23 is varied in accordance with the output of the bidirectional counter 27 to vary the overflow value of the variable step number random walk filter 23, when the result of comparison at the phase comparator 22 represents a lead in output phase, the count value of the bidirectional counter 27 is decremented by one, but on the contrary when the result of comparison represents a lag in output phase, the count value of the bidirectional counter 27 is incremented by one. When the bidirectional counter of the variable step number random walk filter 23 overflows on the positive side as a result of repetition of such operations, the dividing ratio of the divider 21 is changed to N−1 and the count value of the bidirectional counter of the variable step number random walk filter 23 is cleared to the initial value 0, but when the bidirectional counter of the variable step number random walk filter 23 overflows on the negative side, the dividing ratio of the divider 21 is changed to N+1 and the count value of the bidirectional counter of the variable step number random walk filter 23 is cleared to the initial value 0. It is to be noted that, when the bidirectional counter of the variable step number random walk filter 23 does not overflow, the dividing ratio of the divider 21 is maintained equal to N.

The divider 21 divides the master clock signal by the dividing ratio thus determined by the variable step number random walk filter 23, and the phase comparator 22 compares the phases of the division output of the divider 21 and the input clock signal with each other.

For example, when the step number of the variable step number random walk filter 23 is "1", since the output signal leads in phase with respect to the input signal at a point of time (A) in FIG. 2 (refer to the waveforms (a), (b) and (c) in FIG. 2), the phase comparator 22 outputs, as a result of comparison, a signal to decrease the count value of the variable step number random walk filter 23 by "1" (refer to the waveform (d) in FIG. 2).

Further, at another point of time (B) in FIG. 2, since the output signal lags in phase with respect to the input signal (refer to the waveforms (a), (b) and (c) in FIG. 2), the phase comparator 22 outputs, as a result of comparison, a signal to increase the count value of the variable step number random walk filter 23 by "1" (refer to the waveform (d) in FIG. 2).

By the way, the variable step number random walk filter 23 overflows when the count value is "1" or "−1". Accordingly, when the count value is "1", the variable step number random walk filter 23 changes the dividing ratio of the divider 21 to N−1 and clears the count value thereof to the initial value "0", but when the count value is "−1", the variable step number random walk filter 23 changes the dividing ratio of the divider 21 to N+1 and clears the count value thereof to the initial value "0".

Meanwhile, for example, in such operation of the digital PLL circuit as illustrated in FIG. 3, the dividing ratio is set to N−1 by the variable step number random walk filter 23 having the step number "1" similarly as described above till a point of time (A).

Here, since the result of comparison in phase by the phase comparator 22 represents a "lag", the binary information "0" is outputted as the result of determination to the variable step number random walk filter 23 at another point of time (B) (refer to the waveform (b) in FIG. 3).

Accordingly, at the point of time (B), the variable step number random walk filter 23 receiving the result of determination sets the count value to "−1" and outputs a controlling signal to the divider 21 to control the dividing ratio to be set to N+1 (refer to the waveforms (c) and (f) at the point of time (B) in FIG. 3).

It is to be noted that the controlling signal to vary the dividing ratio to N+1 is stored in advance in the register 25.

By the way, since the information of the phase controlling direction of the variable step number random walk filter 23 has changed in the process from the point of time (A) to the point of time (B), the coincidence detecting circuit 26 detects this and outputs it to the bidirectional counter 27. Upon reception of the detection signal, the bidirectional counter 27 outputs a controlling signal to the variable step number random walk filter 23 to vary the step number of the same.

More particularly, in the process from the point of time (A) to the point of time (B), the count value as the overflow value is reversed from "1" to "−1". Thus, at a further point of time (C), the bidirectional counter 27 outputs a controlling signal, and in accordance with the controlling signal, the step number of the variable step number random walk filter 23 is changed to "2".

It is to be noted that, since the count value does not reach the overflow value at the point of time (C), the dividing ratio of the divider 21 is maintained equal to N.

Meanwhile, since the result of comparison in phase by the phase comparator 22 at the point of time (C) represents a "lag", the binary information "0" is outputted as a result of comparison to the variable step number random walk filter 23.

Upon reception of the binary information "0", the variable step number random walk filter 23 decrements the count value thereof by "1" to "−2". Since the new count value is an overflow value, the variable step number random walk filter 23 outputs a controlling signal to the divider 21 so as to control the dividing ratio to be changed to N+1 (refer to the waveforms (c) and (f) at a still further point of time (D) in FIG. 3).

On the other hand, since the phase controlling signal to change the dividing ratio to N+1 at the point of time (D) and the phase controlling signal stored in the register 25 to change the dividing ratio to N+1 at the point of time (B) coincide with each other, in response to a controlling signal from the bidirectional counter 27, the step number of the variable step number random walk filter 23 is decremented by "1" to "1" (refer to the waveform (d) at a yet further point of time (E) in FIG. 3).

At each of points of time (F), (G) and (H), the step number is increased in a similar manner as in the case at the point of time (C).

By such operations as described above, the integration time constant of the variable step number random walk filter 23 can be varied adaptively in response to a frequency error of the master clock signal so that phase control can be performed at suitable intervals. Consequently, an out-of-phase condition and a jitter can be suppressed to the utmost.

b. Second Embodiment

Figure 4:
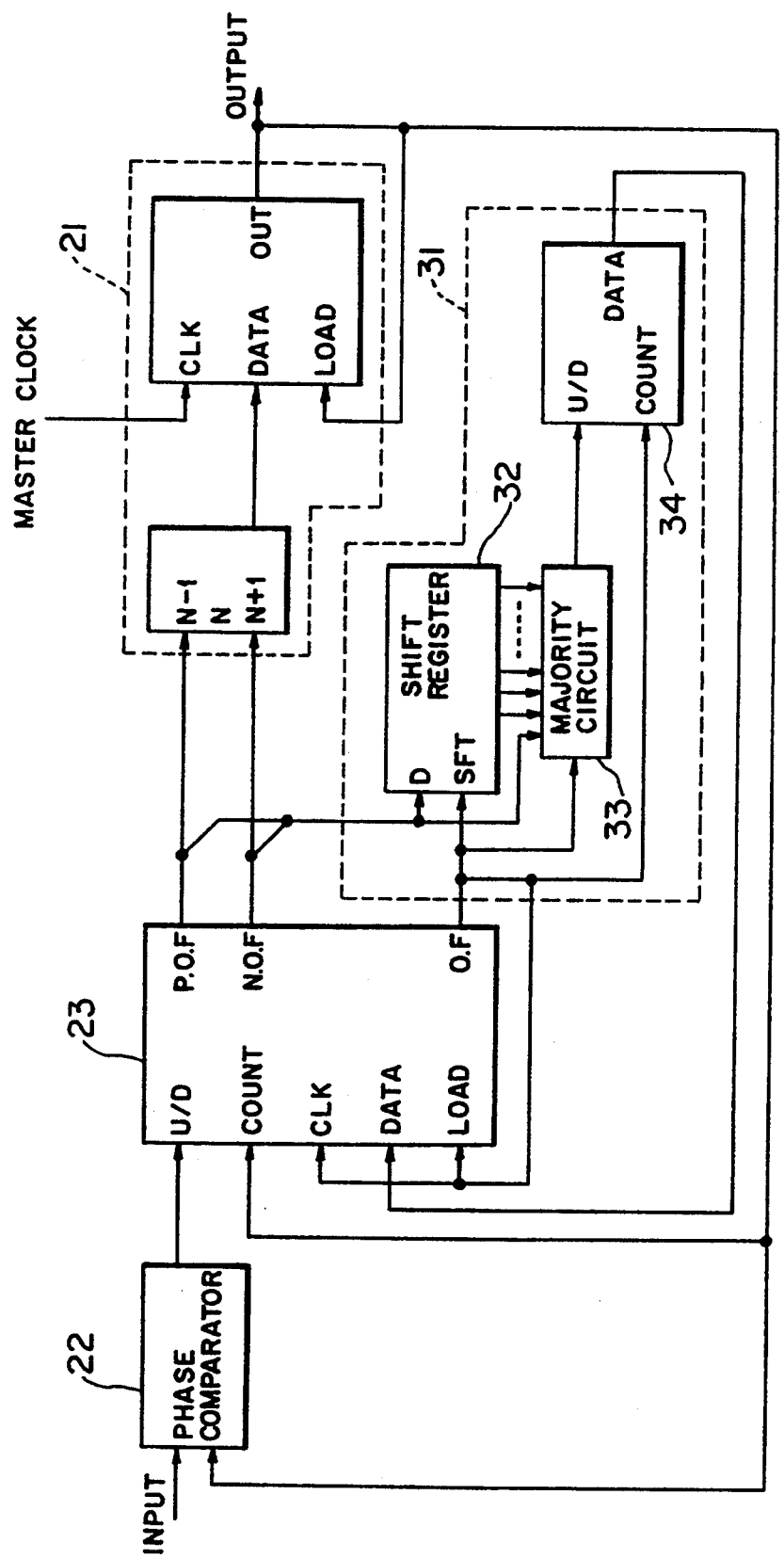
FIG. 4 is a block diagram of another digital PLL circuit showing a second preferred embodiment of the present invention.

Referring now to FIG. 4, there is shown a digital PLL circuit according to a second preferred embodiment of the present invention. The digital PLL circuit shown includes a divider 21, a phase comparator 22, and a variable step number random walk filter 23 having a variable step number, similarly to the digital PLL circuit shown in FIG. 1.

The digital PLL circuit further includes an integration time constant setting circuit 31 for varying the step number of the variable step number random walk filter 23 in accordance with information of a phase controlling direction in the past and information of a phase controlling direction at present to vary the time constant thereof. In particular, the integration time constant setting circuit 31 takes the majority of information of a plurality of phase controlling directions in the past and information of a phase controlling direction at present to vary the step number of the variable step number random walk filter 23 so that, when the phase controlling directions are one-sided, the step number is decreased, but on the contrary when the phase controlling directions are not one-sided, the step number is increased. The integration time constant setting circuit 31 includes a shift register 32, a majority circuit 33 and a bidirectional counter 34.

Here, the shift register 32 stores information of a plurality of phase controlling directions in the past and at present successively in a time series relationship therein. The majority circuit 33 takes, based on the output of the shift register 32, the majority of the information of the phase controlling directions in the past and the information of the phase controlling direction at present to determine whether or not the phase controlling directions are one-sided. The majority circuit 33 includes a cumulative adding circuit 33a and a judging circuit 33b as shown in FIG. 5.

Figure 5:
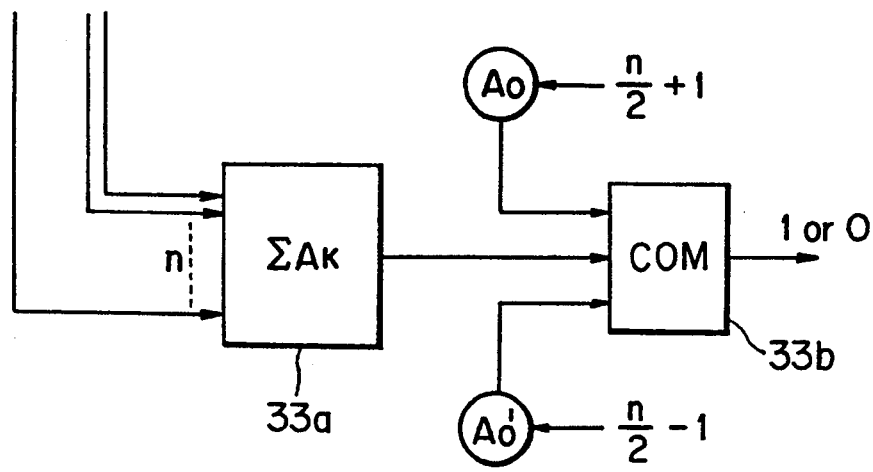
FIG. 5 is a functional block diagram showing a majority circuit of the digital PLL circuit of FIG. 4.
Figure 6:
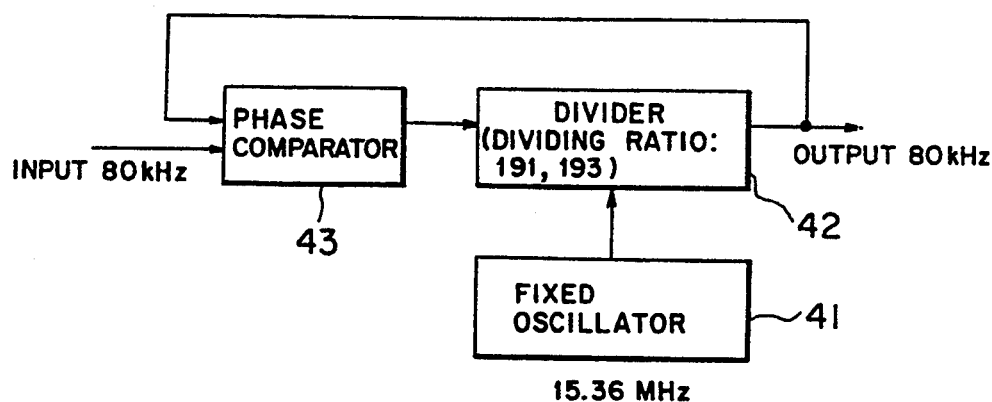
FIG. 6 is a block diagram showing a conventional digital PLL circuit.
Figure 7A:
FIGS. 7(a-c) are a time chart illustrating operation of the digital PLL circuit of FIG. 6 when the output lags in phase with respect to the input.
Figure 7B:
Figure 7C:
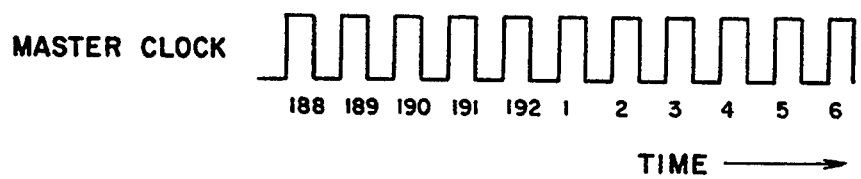

Referring to FIG. 5, the cumulative adding circuit 33a cumulatively adds information of a plurality of (in the present embodiment, totaling n) phase controlling directions in the past and at present stored in a time series relationship in the shift register 32 to obtain integration information.

Meanwhile, the judging circuit 33b judges from the result of calculation by the cumulative adding circuit 33a whether or not the phase controlling directions are one-sided, and when the phase controlling directions are one-sided, the judging circuit 33b decrements the bidirectional counter 34, but on the contrary when the phase controlling directions are not one-sided, the judging circuit 33b increments the bidirectional counter 34.

In particular, when the result $\Sigma A_k$ of calculation by the cumulative adding circuit 33a does not satisfy the following equation (1):

$$(n/2)-1 \leq \Sigma A_k \leq (n/2)+1 \tag{1}$$

the judging circuit 33b judges that the phase controlling directions are one-sided, but on the contrary when the equation (1) above is satisfied, the judging circuit 33b judges that the phase controlling directions are not one-sided.

Referring back to FIG. 4, the bidirectional counter 34 outputs, when the count value thereof decremented as the result of judgment by the majority circuit 33 that the phase controlling directions are one-sided exceeds an overflow value of the bidirectional counter 34, a controlling signal to the random walk filter 23 to decrease the step number, but on the contrary when the count value thereof incremented as the result of judgment by the majority circuit 33 that the phase controlling directions are not one-sided exceeds another overflow value of the bidirectional counter 34, the bidirectional counter 34 outputs another controlling signal to the random walk filter 23 to increase the step number.

In operation, the majority circuit 33 takes the majority of information of a plurality of phase controlling directions in the past and information of a phase controlling direction at present stored in advance successively in a time series relationship in the shift register 32 of the integration time constant setting circuit 31 to determine whether or not the phase controlling directions are one-sided. Then, when the phase controlling directions are one-sided, the majority circuit 33 decrements the bidirectional counter 34, but on the contrary when the phase controlling directions are not one-sided, the majority circuit 33 increments the bidirectional counter 34. The count value of the bidirectional counter 34 acts as a step number input to the variable step number random walk filter 23. It is to be noted that the other operation of the digital PLL circuit is similar to that of the digital PLL circuit shown in FIG. 1 and overlapping description thereof is omitted herein to avoid redundancy.

The divider 21 divides the master clock signal by the dividing ratio thus obtained from the variable step number random walk filter 23, and the comparator 22 effects comparison between the phases of the division output of the divider 21 and the input clock signal.

By such operations as described above, the integration time constant of the variable step number random walk filter 23 can be varied adaptively in response to a frequency error of the master clock signal so that phase control can be performed at suitable intervals. Consequently, also with the digital PLL circuit of the present second embodiment, an out-of-phase condition and a jitter can be suppressed to the utmost.

The present invention is not limited to the specifically described embodiment, and variations and modifications may be made without departing from the scope of the present invention.

What is claimed is:

1. A digital PLL circuit, comprising:
   a master clock oscillator for oscillating a master clock signal having a frequency equal to N times the frequency of an input clock signal, N being an integral number;
   a variable dividing ratio divider for dividing the master clock signal received from said master clock oscillator by a dividing ratio which is normally equal to N, the dividing ratio of said divider being temporarily variable to another integral number around N;
   a phase comparator for comparing the phases of a division output of said divider and the input clock signal with each other;
   a variable step number random walk filter interposed between said phase comparator and said divider and having a selectively settable integration time constant for providing an output to temporarily vary the dividing ratio of said divider; and
   an integration time constant setting circuit, coupled to said random walk filter, for varying the step number of said random walk filter in accordance with information of the last phase controlling direction and information of a phase controlling direction at present obtained from the output of said random walk filter to vary the integration time constant of said random walk filter.

2. A digital PLL circuit as claimed in claim 1, wherein said integration time constant setting circuit determines whether or not information of a phase controlling direction in the last phase control cycle and said information of a phase controlling direction at present obtained from the output of said random walk filter coincide with each other and varies the step number of said random walk filter such that it decreases the step number when the information of the two phase controlling directions coincides with each other, but it increases the step number when the information of the two phase controlling directions does not coincide with each other.

3. A digital PLL circuit as claimed in claim 2, wherein said integration time constant setting circuit includes a coincidence detecting circuit for determining whether or not the information of the phase controlling direction in the last phase controlling cycle and said information of the phase controlling direction at present coincide with each other, and a bidirectional counter for outputting a controlling signal to said random walk filter to decrease the step number of the filter when said coincidence detecting circuit determines coincidence of the information of the phase controlling direction in the last phase controlling cycle and said information of the phase controlling direction at present but outputting another controlling signal to said random walk filter to increase the step number of the filter when said coincidence detecting circuit determines that the information of the phase controlling direction in the last phase controlling cycle does not coincide with said information of the phase controlling direction at present.

4. A digital PLL circuit as claimed in claim 1, wherein said integration time constant setting circuit takes the majority of information of a plurality of last phase controlling directions and said information of a phase controlling direction at present and varies the step number of said random walk filter such that it decreases the step number when the phase controlling directions are one-sided but increases the step number when the phase controlling directions are not one-sided.

5. A digital PLL circuit as claimed in claim 4, wherein said integration time constant setting circuit includes a shift register for storing information of a plurality of last phase controlling directions and said information of a phase controlling direction at present obtained from the output of said random walk fitter successively in a time series relationship therein, a majority circuit for taking the majority of the information of the plurality of last phase controlling directions and the information of the phase controlling direction at present based on an output of said shift register, and a bidirectional counter for outputting a controlling signal to said random walk filter to decrease the step number of the filter when said majority circuit determines that the phase controlling directions are one-sided but outputting another controlling signal to said random walk filter to increase the step number of the filter when said majority circuit determines that the phase controlling directions are not one-sided.

6. A digital PLL circuit as claimed in claim 5, wherein said majority circuit includes a cumulative adding circuit for cumulatively adding the information of the plurality of last phase controlling directions and said information of the phase controlling directions at said information of the phase controlling directions at present obtained from the output of said random walk filter successively stored in a time series relationship in said shift register to obtain integration information, and a judging circuit for judging from a result of calculation by said cumulative adding circuit whether or not the phase controlling directions are one-sided and for decrementing said bidirectional counter when the phase controlling directions are one-sided but incrementing the bidirectional counter when the phase controlling directions are not one-sided.

7. A digital PLL circuit as claimed in claim 1, wherein said random walk filter is formed as a bidirectional counter having a variable overflow value.

8. A digital PLL circuit as claimed in claim 1, wherein the dividing ratio of said variable dividing ratio divider is temporarily variable to $N-1$ or $N+1$ in response to the output of said random walk filter.

* * * * *